(12) United States Patent
Kim et al.

(10) Patent No.: US 9,795,918 B2
(45) Date of Patent: Oct. 24, 2017

(54) VACUUM ADSORPTION APPARATUS AND A VACUUM ADSORPTION METHOD OF SEMICONDUCTOR PACKAGE

(71) Applicant: Samsung Electronics Co., Ltd., Suwon-si, Gyeonggi-do (KR)

(72) Inventors: Yong-Ki Kim, Asan-si (KR); Joo-Hoon Choi, Seoul (KR)

(73) Assignee: SAMSUNG ELECTRONICS CO., LTD. (KR)

(*) Notice: Subject to any disclaimer, the term of this patent is extended or adjusted under 35 U.S.C. 154(b) by 242 days.

(21) Appl. No.: 14/656,645

(22) Filed: Mar. 12, 2015

(65) Prior Publication Data
US 2015/0311059 A1    Oct. 29, 2015

(30) Foreign Application Priority Data
Apr. 28, 2014    (KR) .................. 10-2014-0050752

(51) Int. Cl.
*B01D 53/02* (2006.01)
*B01D 53/26* (2006.01)
*H01L 21/67* (2006.01)
*H01L 21/683* (2006.01)

(52) U.S. Cl.
CPC ...... *B01D 53/261* (2013.01); *H01L 21/67034* (2013.01); *H01L 21/6838* (2013.01)

(58) Field of Classification Search
CPC ............ B01D 53/261; H01L 21/67034; H01L 21/6838
See application file for complete search history.

(56) References Cited

U.S. PATENT DOCUMENTS

| | | | |
|---|---|---|---|
| 6,590,633 B1 * | 7/2003 | Nishi | G03F 7/70358 269/21 |
| 2007/0063402 A1 * | 3/2007 | Soyama | B25B 11/005 269/21 |
| 2008/0287081 A1 | 11/2008 | Van Dam et al. | |
| 2009/0321014 A1 * | 12/2009 | Ohashi | H01L 21/563 156/305 |
| 2015/0034702 A1 * | 2/2015 | Zhang | H01L 24/75 228/176 |
| 2015/0235984 A1 * | 8/2015 | Aoyagi | H01L 24/81 438/107 |

FOREIGN PATENT DOCUMENTS

| | | |
|---|---|---|
| JP | 2011035369 A | 2/2011 |
| KR | 1999017355 | 3/1999 |
| KR | 100546043 | 1/2006 |
| KR | 20060010605 | 2/2006 |

(Continued)

*Primary Examiner* — Christopher P Jones
(74) *Attorney, Agent, or Firm* — Renaissance IP Law Group LLP

(57) ABSTRACT

Provided is a vacuum adsorption apparatus and a method of adsorbing a semiconductor package in a vacuum state. The vacuum adsorption apparatus includes a housing having an opening formed on its top surface, a vacuum adsorption unit disposed in the housing, and a stage formed on the opening formed in the housing and including a plurality of holes. A pressure generated from the vacuum adsorption unit is applied to the top surface of the stage through the opening and the plurality of holes.

16 Claims, 15 Drawing Sheets

(56) References Cited

FOREIGN PATENT DOCUMENTS

| KR | 100795966 | 1/2008 |
| KR | 100864590 | 10/2008 |
| KR | 100920934 | 10/2009 |
| KR | 101009045 | 1/2011 |
| KR | 101117256 | 2/2012 |

* cited by examiner

VACUUM ADSORPTION APPARATUS AND A VACUUM ADSORPTION METHOD OF SEMICONDUCTOR PACKAGE

CROSS-REFERENCE TO RELATED APPLICATION

This application claims priority to Korean Patent Application No. 10-2014-0050752 filed on Apr. 28, 2014 in the Korean Intellectual Property Office, the contents of which are herein incorporated by reference in their entirety.

BACKGROUND

1. Technical Field

The present inventive concept relates to a vacuum adsorption apparatus and a method of manufacturing a semiconductor package.

2. Description of the Related Art

In a semiconductor assembling process, specifically in a saw sorter step, semiconductor packages in forms of strips are cut into individual packages and it is then determined whether the cut semiconductor packages are failed or not to sort failed semiconductor packages, followed by cleaning and drying, to then loaded in a tray.

In the saw sorter step, an adsorption apparatus for fixing the semiconductor packages on a stage can be used to prevent the semiconductor packages from shaking during the cutting, cleaning and drying steps. The semiconductor packages can be fixed using the adsorption apparatus to enable accurate cutting, cleaning and drying of semiconductor packages without being separated from the stage.

SUMMARY

The present inventive concept provides a vacuum adsorption apparatus of a semiconductor package, which can be compatibly used, irrespective of the size of the semiconductor package while efficiently maintaining an adsorptive force of the semiconductor package.

The present inventive concept also provides a vacuum adsorption method of a semiconductor package, which can be compatibly used, irrespective of the size of the semiconductor package while efficiently maintaining an adsorptive force of the semiconductor package.

According to an aspect of the present inventive concept, there is provided a vacuum adsorption apparatus of a semiconductor package, the vacuum adsorption apparatus including a housing having an opening formed on its top surface, a vacuum adsorption unit disposed in the housing, and a stage formed on the opening formed in the housing and including a plurality of holes, wherein a pressure generated from the vacuum adsorption unit is applied to the top surface of the stage through the opening and the plurality of holes.

According to another aspect of the present inventive concept, there is provided a vacuum adsorption apparatus of a semiconductor package, the vacuum adsorption apparatus including a stage on which a plurality of holes are formed and a semiconductor package is mounted, at least one vacuum cartridge positioned under the stage and generating an adsorptive force through a suction hole according to passage of compressed air, and a housing in which the vacuum cartridge is accommodated and which supports the stage, wherein the semiconductor package is fixed on the stage by the adsorptive force of the vacuum cartridge.

According to an aspect of the present inventive concept, there is provided a vacuum adsorption method of a semi-conductor package, the vacuum adsorption method including providing a stage including a plurality of holes, mounting at least one semiconductor package on the stage and generating an adsorptive force under the stage to adsorb and fix the semiconductor package.

BRIEF DESCRIPTION OF THE DRAWINGS

The above and other features and advantages of the present inventive concept will become more apparent by describing in detail preferred embodiments thereof with reference to the attached drawings in which.

DETAILED DESCRIPTION OF THE EMBODIMENTS

Figure 1:
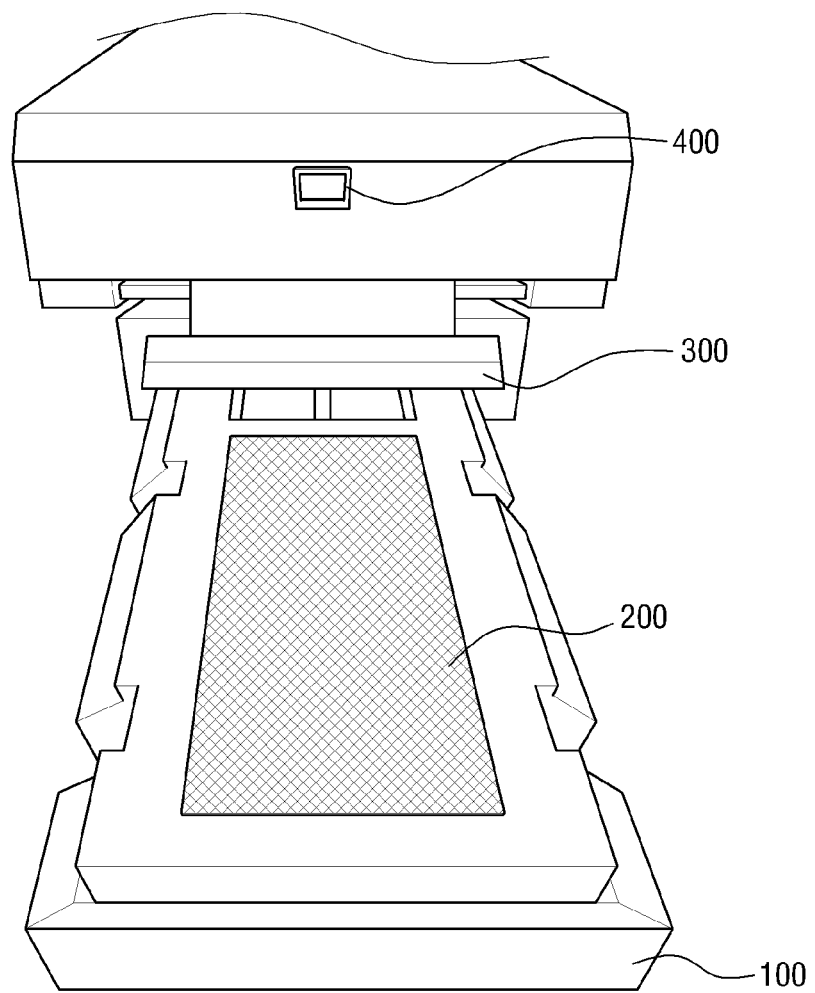
FIG. 1 is a perspective view illustrating a configuration of a vacuum adsorption apparatus of a semiconductor package according to an embodiment of the present inventive concept.

Advantages and features of the present inventive concept and methods of accomplishing the same may be understood more readily by reference to the following detailed description of preferred embodiments and the accompanying drawings. The present inventive concept may, however, be embodied in many different forms and should not be construed as being limited to the embodiments set forth herein. Rather, these embodiments are provided so that this disclosure will be thorough and complete and will fully convey the concept of the inventive concept to those skilled in the art, and the present inventive concept will only be defined by the appended claims. Like reference numerals refer to like elements throughout the specification.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element or layer is referred to as being "on", "connected to" or "coupled to" another element or layer, it can be directly on, connected or coupled to the other element or layer or intervening elements or layers may be present. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Embodiments are described herein with reference to cross-section illustrations that are schematic illustrations of idealized embodiments (and intermediate structures). As such, variations from the shapes of the illustrations as a result, for example, of manufacturing techniques and/or tolerances, are to be expected. Thus, these embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

A vacuum adsorption apparatus of a semiconductor package according to an embodiment of the present inventive concept will be described with reference to FIGS. 1 to 10. FIG. 1 is a perspective view illustrating a configuration of a vacuum adsorption apparatus of a semiconductor package according to an embodiment of the present inventive concept and FIG. 2 is a conceptual diagram of a side surface for explaining the configuration of the vacuum adsorption apparatus of the semiconductor package according to an embodiment of the present inventive concept.

Figure 2:
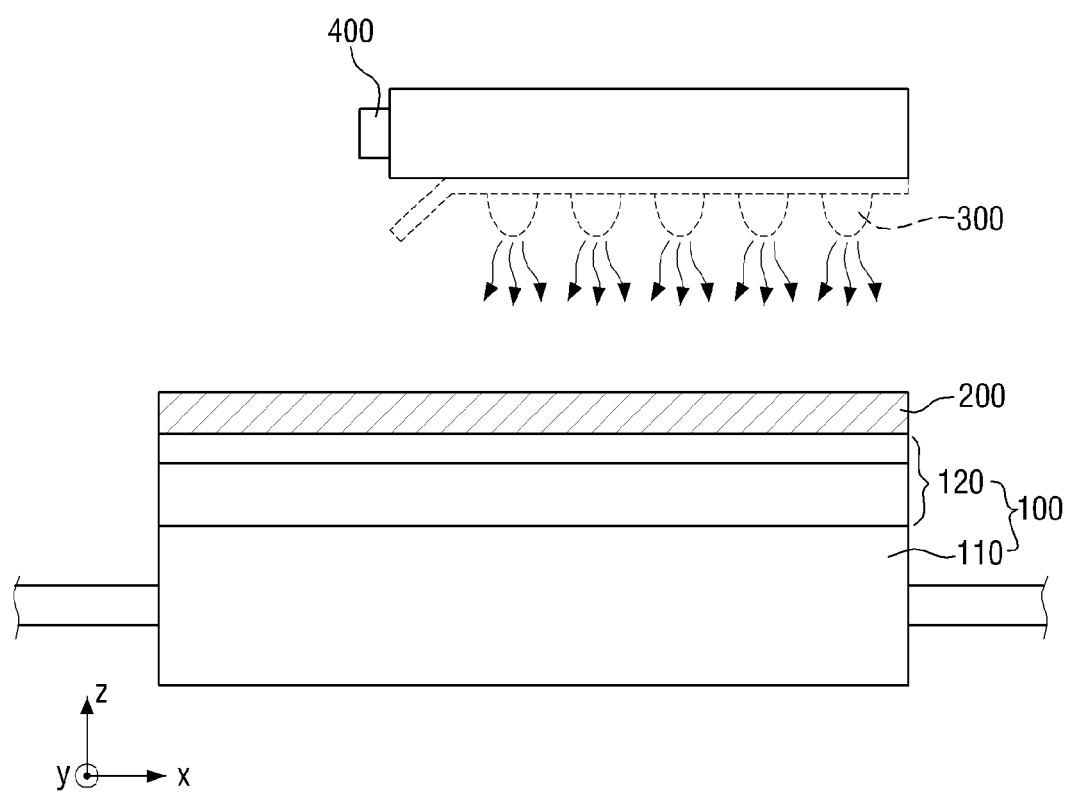
FIG. 2 is a conceptual diagram of a side surface for explaining the configuration of the vacuum adsorption apparatus of the semiconductor package according to an embodiment of the present inventive concept.

Referring to FIGS. 1 and 2, the vacuum adsorption apparatus of a semiconductor package according to an embodiment of the present inventive concept includes a housing 100, a stage 200, a drying unit 300 and an instrument panel 400.

The housing 100 may be positioned under the vacuum adsorption apparatus of a semiconductor package according to an embodiment of the present inventive concept. The housing 100 may be shaped as a rectangular parallelepiped, but not limited thereto. The housing 100 may have any shape that is capable of covering the stage 200. The housing 100 may have an entrance space formed therein. The housing 100 may include a vacuum adsorption unit 130. Therefore, the housing 100 should have a volume large enough to receive the vacuum adsorption unit 130.

The housing 100 includes a lower housing 110 and an upper housing 120. The lower housing 110 and the upper housing 120 are combined with each other. The lower housing 110 may be positioned below the upper housing 120. The upper housing 120 and the lower housing 110 are combined with each other and have the entrance space formed therebetween.

The stage 200 may be positioned on the housing 100. In an embodiment, the stage 200 may cover a top portion of the upper housing 120. The stage 200 makes contact with the upper housing 120 but is not adhered to the upper housing 120. In an embodiment, the stage 200 may be adhered to the upper housing 120.

The stage 200 may enable a semiconductor package to be mounted thereon. The stage 200 may be shaped to be planar to allow the semiconductor package to be mounted thereon. The stage 200 may have a top surface wide enough to mount a plurality of semiconductor packages. The plurality of semiconductor packages may be arranged on the top surface of the stage 200 to be mounted thereon.

The top surface of the stage 200 may comprise silicon, but not limited thereto. Since the top surface of the stage 200 comprises silicon, it is possible to prevent the semiconductor packages mounted on the top surface of the stage 200 from slipping. The stage 200 may include a rigid metal to support the semiconductor packages on the opening 150 of the upper housing 120. In an embodiment, the top surface of the stage 200 may comprise silicon to prevent the semiconductor packages from slipping.

The drying unit 300 may be positioned on the housing 100 and the stage 200. The drying unit 300 may include a plurality of air blows. The air blows may spray a second fluid to dry moisture of the semiconductor package. The second fluid used in the air blows may be air according to an embodiment. Any fluid can be used as the second fluid as long as it is capable of drying the moisture of the semiconductor package. For example, the second fluid may be compressed air or inert gas according to an embodiment.

The drying unit 300 may overlap at least a portion of the top surface of the stage 200 on the housing 100 and the stage 200. Even if the drying unit 300 does not entirely overlap the stage 200, it may spray the second fluid on the entire top surface of the stage 200 by adjusting a spraying direction of the second fluid. That is, the drying unit 300 including the plurality of air blows may spray the second fluid from some of the air blows with a predetermined slope. Accordingly, the moisture of the semiconductor package on the stage 200 can be completely dried.

The instrument panel 400 may indicate a vacuum pressure within the housing 100. The vacuum adsorption unit 130 may be disposed within the housing 100, for example, below the stage 200. The vacuum adsorption unit 130 may generate a vacuum pressure to fix the semiconductor package on the stage 200. Here, the vacuum pressure generated from the vacuum adsorption unit 130 may be indicated on the instrument panel 400. The instrument panel 400 indicates the vacuum pressure and an output of the vacuum adsorption unit 130 within the housing 100 may be adjusted according to the vacuum pressure indicated on the instrument panel 400.

Hereinafter, configurations of a housing and a vacuum adsorption unit in the vacuum adsorption apparatus of the semiconductor package according to an embodiment of the present inventive concept will be described with reference to FIG. 3.

Figure 3:
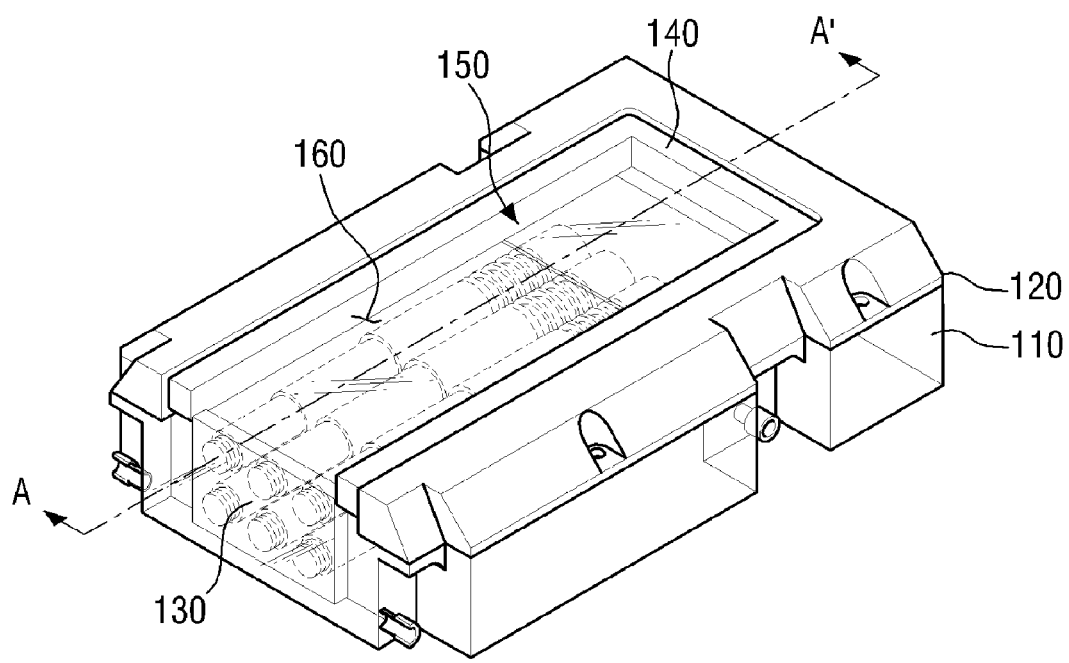
FIG. 3 is a perspective view illustrating configurations of a housing and a vacuum adsorption unit in the vacuum adsorption apparatus of the semiconductor package according to an embodiment of the present inventive concept.

FIG. 3 is a perspective view illustrating configurations of a housing and a vacuum adsorption unit in the vacuum adsorption apparatus of the semiconductor package according to an embodiment of the present inventive concept.

Referring to FIG. 3, the vacuum adsorption apparatus of the semiconductor package according to an embodiment of the present inventive concept includes an upper housing 120, a lower housing 110, an entrance space 160, an opening 150, a closing unit 140 and a vacuum adsorption unit 130.

In an embodiment, the lower housing 110 may have a hexahedron shape according to an embodiment. The outer periphery of the lower housing 110 may have a constant or downwardly increasing area of a horizontal cross section to be placed on a base surface with stability.

The lower housing 110 may include the entrance space 160 provided therein. The lower housing 110 may receive the vacuum adsorption unit 130. Therefore, the entrance space 160 provided in the lower housing 110 is wide and deep enough to receive the vacuum adsorption unit 130.

The lower housing 110 may be combined with the upper housing 120. The lower housing 110 is able to hold the entrance space 160 provided therein even after the lower housing 110 is combined with the upper housing 120.

The upper housing 120 may be combined with the lower housing 110. The upper housing 120 may include the opening 150. The upper housing 120 may expose the entrance space 160 of the lower housing 110 through the opening 150. In an embodiment, the upper housing 120 may be combined with the lower housing 110 using a fastening unit, such as a bolt. The upper housing 120 can be securely combined with the lower housing 110 to completely seal the entrance space 160, except for the opening 150 according to an embodiment of the inventive concept.

The vacuum adsorption unit 130 may be received in the entrance space 160. The entrance space 160 may receive at least one vacuum adsorption unit 130. Therefore, the entrance space 160 may be sized to be wide and deep enough to receive the at least one vacuum adsorption unit 130.

The opening 150 may entirely expose the entrance space 160 of the lower housing 110, but aspects of the present inventive concept are not limited thereto. That is, the opening 150 may expose at least a portion of the entrance space 160 of the lower housing 110. That is, a width of the horizontal cross section of the opening 150 may be smaller than that of the horizontal cross section of the entrance space 160.

The vacuum adsorption unit 130 may generate a vacuum pressure. The vacuum adsorption unit 130 may generate an adsorptive force based on the vacuum pressure. The vacuum adsorption unit 130 may include one of a vacuum cartridge, a vacuum pad and a vacuum pump. FIG. 3 illustrates a vacuum cartridge by way of example, but aspects of the present inventive concept are not limited thereto. According to an embodiment, the vacuum adsorption unit 130 is a vacuum cartridge.

The vacuum adsorption unit 130 may include a plurality of vacuum cartridges. The vacuum adsorption unit 130, including the plurality of vacuum cartridges arranged in each plurality of rows and columns, may be inserted into the entrance space 160. The more the vacuum cartridges, the stronger the adsorptive force of the vacuum adsorption unit 130.

The vacuum adsorption unit 130 may have a body shaped as a pillar. The body of the vacuum adsorption unit 130 may have a hollow inner space. A first fluid may pass through the hollow inner space of the vacuum adsorption unit 130. If the first fluid passes through the hollow inner space of the vacuum adsorption unit 130, the internal pressure of the vacuum adsorption unit 130 may be lowered. Accordingly, the adsorptive force may be generated by a suction hole formed in the body of the vacuum adsorption unit 130.

The first fluid passing through the vacuum adsorption unit 130 may be compressed air, but not limited thereto. Any fluid may be used as the first fluid as long as it can pass through the vacuum adsorption unit 130 at a high speed. The vacuum pressure produced from the vacuum adsorption unit 130 may be applied to the top surface of the stage 200 through the opening 150 and a plurality of holes 210 formed in the stage 200.

The vacuum pressure produced from the vacuum adsorption unit 130 may be sensed by a vacuum pressure sensor. The vacuum pressure sensor may transmit the sensed vacuum pressure to the instrument panel 400. The instrument panel 400 may indicate the vacuum pressure sensed by the vacuum pressure sensor.

A controller may increase an output of the vacuum adsorption unit 130 when the measured vacuum pressure is smaller than a predetermined reference vacuum pressure and may decrease the output of the vacuum adsorption unit 130 when the measured vacuum pressure is greater than the predetermined reference vacuum pressure. That is, the controller may automatically control the vacuum pressure.

The closing unit 140 may be formed within the opening 150. According to an embodiment, the closing unit 140 may be formed along a side surface of the opening 150. The closing unit 140 may move up and down. The closing unit 140 may be positioned on the side surface of the opening 150, for example slightly below a top surface of the upper housing 120A. The closing unit 140 is lifted to the top surface of the upper housing 120 to then be brought into close contact with the stage 200 contiguous to the top surface of the upper housing 120. The closing unit 140 may close at least some of the plurality of holes formed on the stage 200.

Hereinafter, a connection relationship between each of the housing, the stage and the vacuum adsorption unit will be described with reference to FIG. 4.

Figure 4:
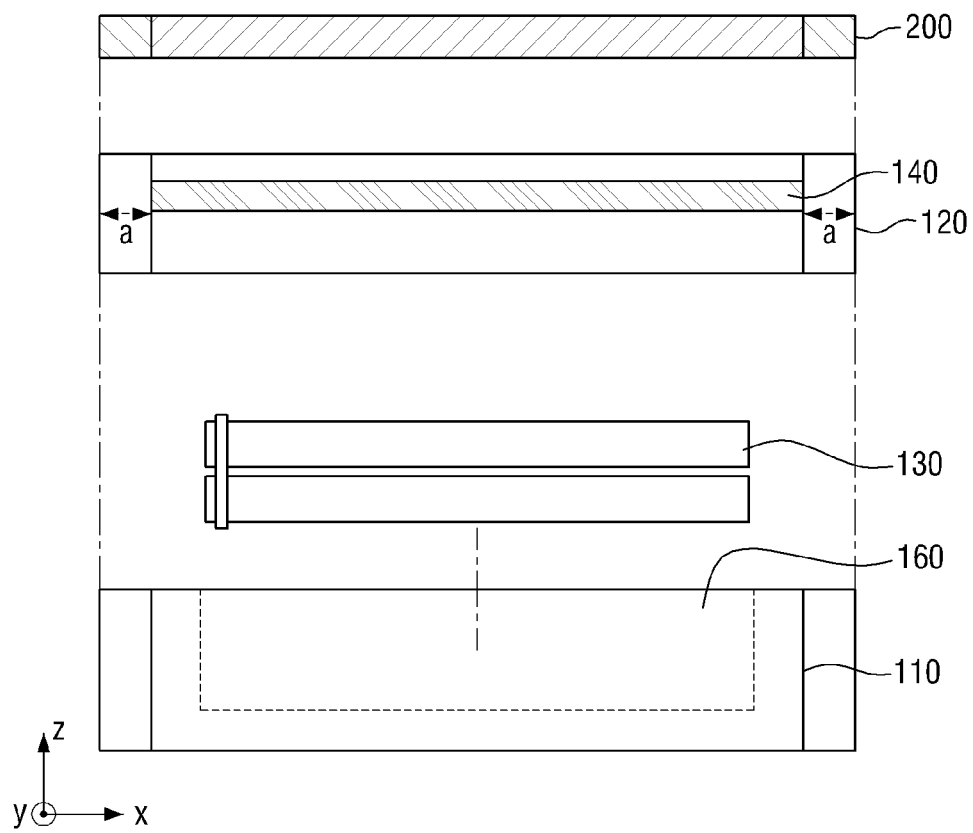
FIG. 4 is an exploded cross-sectional view taken along the line A-A' of FIG. 3 according to an embodiment of the inventive concept.

FIG. 4 is an exploded cross-sectional view taken along the line A-A' of FIG. 3 according to an embodiment of the inventive concept.

Referring to FIG. 4, the lower housing 110 may be positioned at the bottommost part of the vacuum adsorption apparatus. The lower housing 110 may include the entrance space 160 provided therein. The vacuum adsorption unit 130 may be received within the lower housing 110. The vacuum adsorption unit 130 may include a plurality of vacuum cartridges. The vacuum adsorption unit 130 may be received in the entrance space 160 and may be surrounded by the upper housing 120.

The upper housing 120 may be combined with the lower housing 110. The upper housing 120 is able to hold the entrance space 160 provided therein even after the upper housing 120 is combined with the lower housing 110. In such a manner, the vacuum adsorption unit 130 may be received in the entrance space 160.

The upper housing 120 may include the opening 150, and the closing unit 140 may be formed within the opening 150. The opening 150 may be spaced a predetermined distance (a) apart from an end of the upper housing 120. That is, the upper housing 120 may be shaped of a doughnut having a hollow inner space having a thickness corresponding to the predetermined distance (a), but aspects of the present inventive concept are not limited thereto. Since the closing unit 140 is positioned within the opening 150, it may also be spaced the predetermined distance (a) apart from the end of the upper housing 120, but aspects of the present inventive concept are not limited thereto. In other embodiments, the closing unit 140 may exist without a gap between its end and the end of the upper housing 120.

The stage 200 may be disposed on the upper housing 120. The stage 200 may cover the opening 150 of the upper housing 120. The stage 200 may entirely cover the opening 150.

Figure 5:
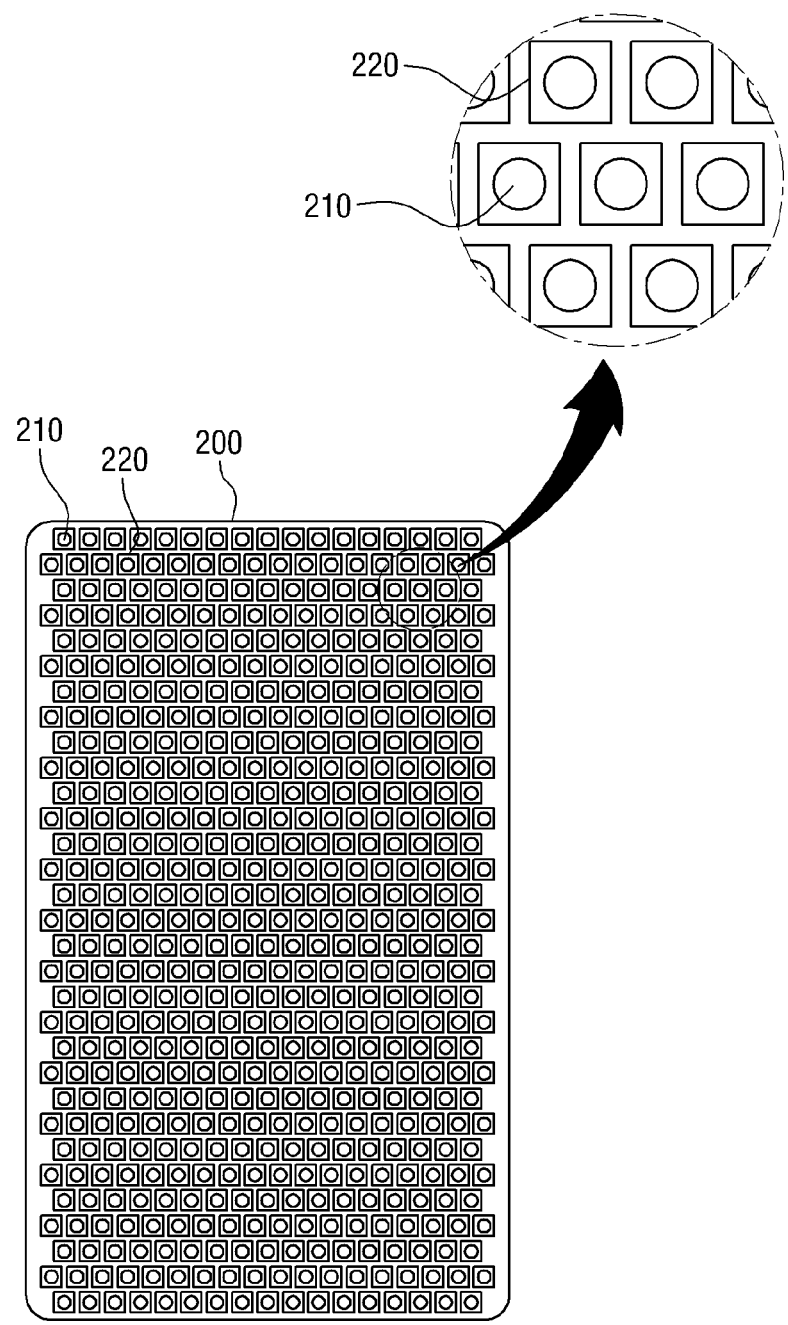
FIG. 5 illustrates a plan view and an enlarged view describing a stage of the vacuum adsorption apparatus of the semiconductor package according to an embodiment of the present inventive concept.

FIG. 5 illustrates a plan view and an enlarged view describing a stage of the vacuum adsorption apparatus of the semiconductor package according to an embodiment of the present inventive concept.

Referring to FIG. 5, the stage 200 includes a hole 210 and a stepped portion 220.

In an embodiment, the hole 210 may be formed while passing through the stage 200. The hole 210 may include a plurality of holes. The plurality of holes 210 may be arranged at regular intervals. As shown, the holes 210 may be periodically arranged. As the plurality of holes 210 are formed on the stage 200, the adsorptive force generated from the vacuum adsorption unit 130 positioned below the stage 200 may be applied to the top surface of the stage 200.

That is, if the semiconductor package is mounted on the top surface of the stage 200, the adsorptive force is generated through the plurality of holes 210 to allow the semiconductor package to be brought into close contact with the top surface of the stage. In such a manner, the semiconductor package may be fixed on the top surface of the stage 200.

The stepped portion 220 may be provided around the hole 210. The stepped portion 220 may be slightly lower than the top surface of the stage 200. The stepped portion 220 may be formed to have a sufficiently smaller size than the semiconductor package to allow the semiconductor package to be placed on the top surface of the stage 200 to be parallel with the top surface of the stage 200. The stepped portion 220 is not particularly limited in view of shape, but may be shaped of a rectangle, as shown.

As the stepped portion 220 is formed around the hole 210, a vacuum area may be considerably increased. Therefore, since the adsorptive force of the semiconductor package is increased, the efficiency of the vacuum adsorption apparatus of the semiconductor package according to an embodiment of the present inventive concept can be increased.

Figure 6:
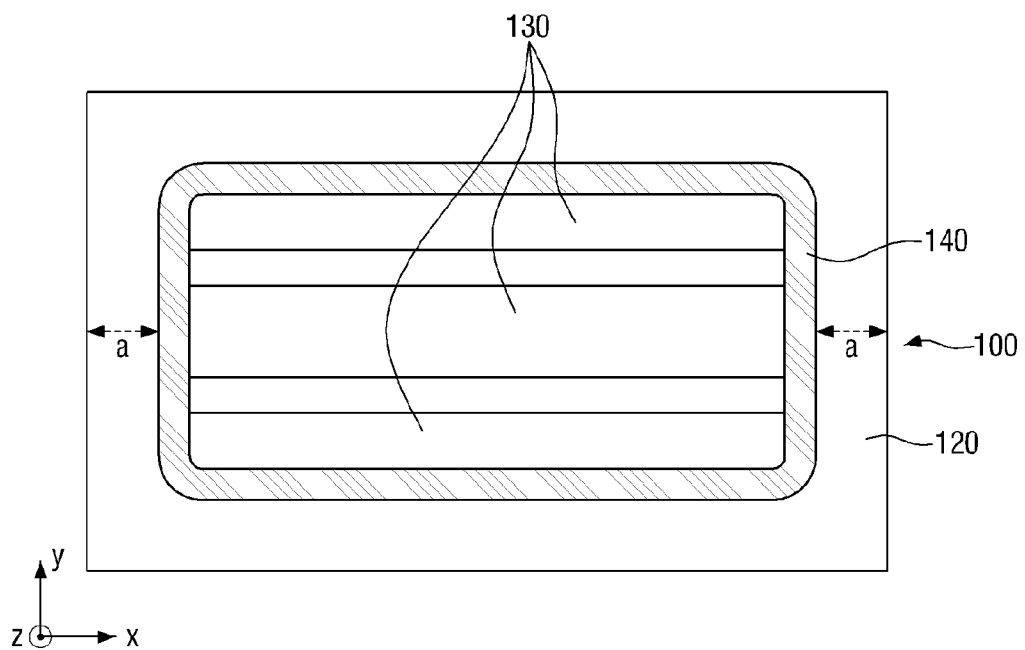
FIG. 6 is a plan view illustrating the configurations of the housing and the vacuum adsorption unit in the vacuum adsorption apparatus of the semiconductor package according to an embodiment of the present inventive concept.
Figure 7:
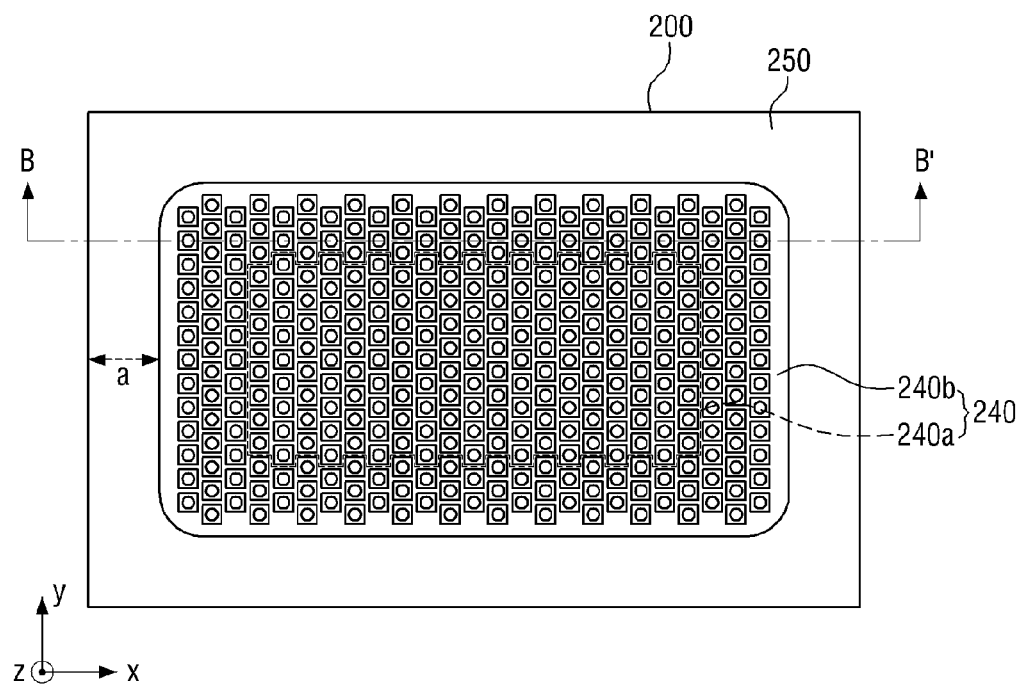
FIG. 7 is a plan view illustrating a structure in which the housing and the vacuum adsorption unit in the vacuum adsorption apparatus of the semiconductor package are assembled with each other according to an embodiment of the inventive concept.
Figure 8:
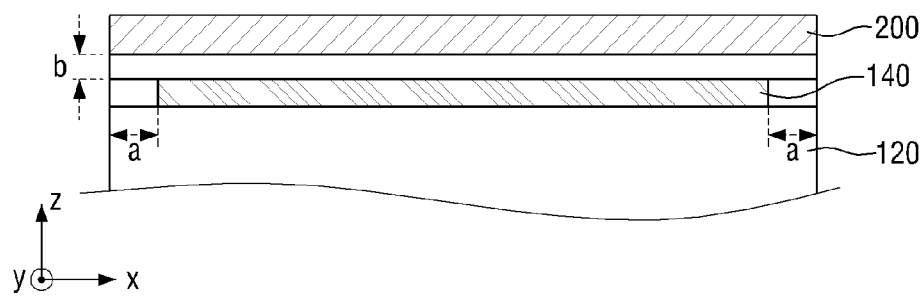
FIG. 8 is an exploded cross-sectional view illustrating the configurations of the housing and the vacuum adsorption unit, taken along the line B-B' of FIG. 7.

FIG. 6 is a plan view illustrating the configurations of the housing and the vacuum adsorption unit in the vacuum adsorption apparatus of the semiconductor package according to an embodiment of the present inventive concept. FIG. 7 is a plan view illustrating a structure in which the housing and the vacuum adsorption unit in the vacuum adsorption apparatus of the semiconductor package are assembled with each other according to an embodiment. FIG. 8 is an exploded cross-sectional view illustrating the configurations of the housing and the vacuum adsorption unit, taken along the line B-B' of FIG. 7.

Referring to FIG. 6, a plan view of the upper housing 120 without the stage 200 is illustrated. The vacuum adsorption unit 130 may be exposed through the opening 150. As described above, the upper housing 120 may include the opening 150 provided therein. The opening 150 may be spaced a predetermined distance (a) apart from a peripheral end of the upper housing 120.

The closing unit 140 may be formed within the opening 150. The closing unit 140 may be formed along an inner surface of the opening 150, but aspects of the present inventive concept are not limited thereto. The closing unit 140 may be formed at any location within the opening 150 as long as it may not entirely close the opening 150.

The closing unit 140 may close at least some of the plurality of holes 210 of the stage 200 covering the opening 150. Referring to FIG. 6, when the closing unit 140 is formed along the peripheral region of the opening 150, the holes 210 of the stage 200 overlapping with the closing unit 140 may be closed.

Referring to FIG. 7, the stage 200 may entirely cover the opening 150 of the upper housing 120. In an embodiment, portions of the upper housing 120, other than the opening 150, may be covered by a first region 250 without the holes 210. The holes 210 may be formed in a second region 240 corresponding to the opening 150 of the stage 200.

The second region 240 may have an open area 240a and a hole opening/closing area 240b. The open area 240a is an area where the closing unit 140 is not provided below the stage 200 and the holes 210 are not closed. The hole opening/closing area 240b is an area where the closing unit 140 is provided below the stage 200 to open or close the holes 210.

Referring to FIG. 8, the closing unit 140 may be spaced a predetermined distance (b) apart from the top surface of the housing 100. Therefore, unless the closing unit 140 makes upwardly close contact with the stage 200, the holes 210 of the stage 200 may not be closed. In an embodiment, since the closing unit 140 is installed within the opening 150, it may be spaced the predetermined distance (a) apart from the peripheral end of the upper housing 120. Since the portion of overlaps with the first region 250 of the stage 200, where the holes 210 are not provided, the closing unit 140 can be omitted.

A driving mechanism of a closing unit of the vacuum adsorption apparatus of the semiconductor package according to an embodiment of the present inventive concept will now be described with reference to FIGS. 9 and 10.

Figure 9:
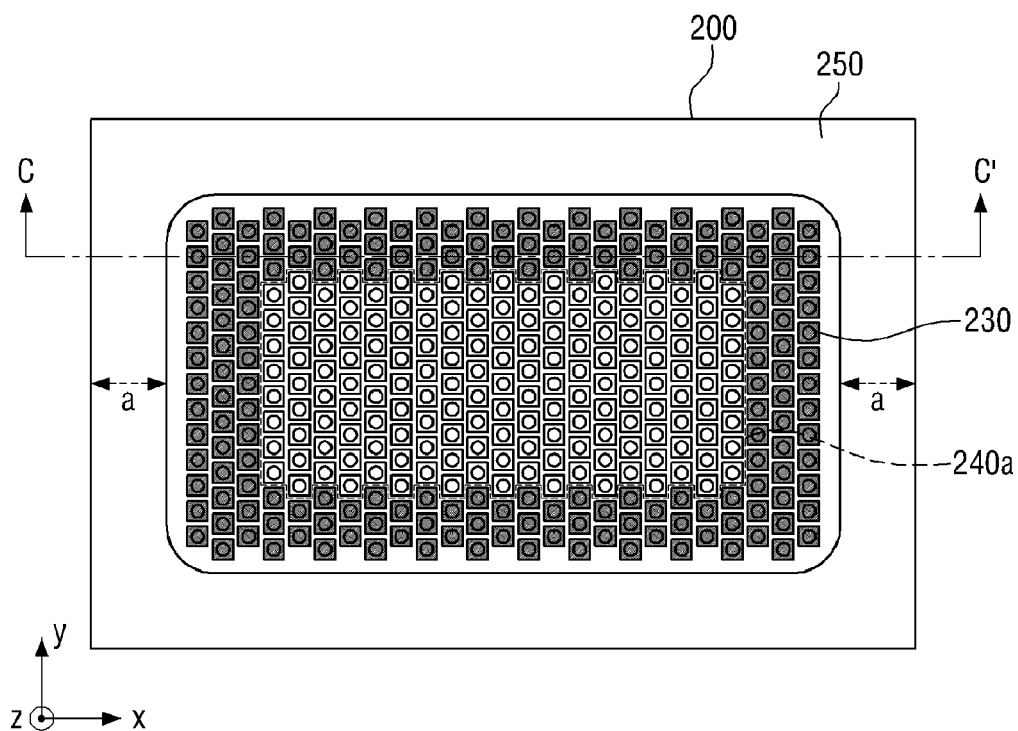
FIG. 9 is a plan view for explaining driving of a closing unit of the vacuum adsorption apparatus of the semiconductor package according to an embodiment of the present inventive concept.

FIG. 9 is a plan view for explaining driving of a closing unit of the vacuum adsorption apparatus of the semiconductor package according to an embodiment of the present inventive concept. FIG. 10 is a cross-sectional view taken along the line C-C' of FIG. 9 according to an embodiment of the inventive concept.

Figure 10:
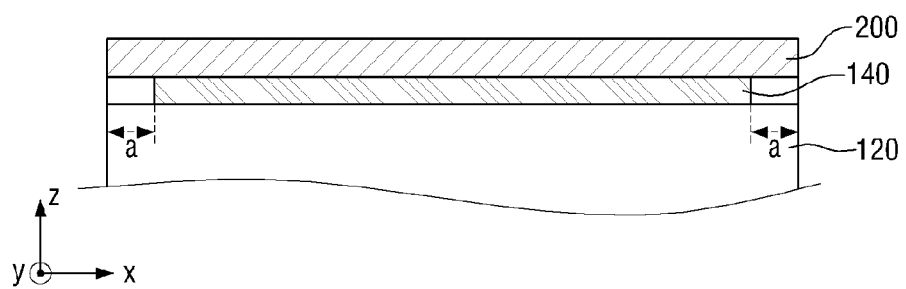
FIG. 10 is a cross-sectional view taken along the line C-C' of FIG. 9 according to an embodiment of the inventive concept.

Referring to FIGS. 9 and 10, the closing unit 140 may entirely close the hole opening/closing area 240b of the second region 240 of the stage 200. The closing unit 140, spaced the predetermined distance (b) apart from the stage 200 contiguous to the top surface of the upper housing 120, may upwardly move.

The closing unit 140 may move to the same height with the top surface of the upper housing 120 to be brought into close contact with the stage 200. In an embodiment, the plurality of holes 210 may remain opened in the open area 240a of the stage 200. Here, all of the plurality of holes 210 may be closed in the hole opening/closing area 240b of the stage 200.

The closing unit 140 may be driven when a small number of semiconductor packages are provided or sizes of semiconductor packages are small. For example, in the case where a small number of semiconductor packages are provided, the semiconductor packages may be arranged in the vicinity of the center of the stage 200 while the semiconductor packages may not be arranged in a peripheral region of the stage 200. Here, when the holes 210 of an area without semiconductor packages arranged therein are opened, the adsorptive force of the vacuum adsorption unit 130 may be wasted. Therefore, the holes 210 not covered by the semiconductor packages are closed by the closing unit 140, thereby preserving the adsorptive force of the vacuum adsorption unit 130. The adsorptive force of the vacuum adsorption unit 130 may be intensively applied to the holes 210 in the open area 240a.

The closing unit 140 may be vertically driven using a cylinder. The cylinder may be, for example, a hydraulic cylinder. The cylinder may include at least one cylinder for driving the closing unit 140. That is, a single cylinder may integrally drive the overall closing unit 140, or a plurality of cylinders may be installed at multiple areas of the closing unit 140 to drive the closing unit 140.

In the vacuum adsorption apparatus of the semiconductor package according to an embodiment of the present inventive concept, since the vacuum adsorption unit 130 generating a vacuum pressure is positioned below the stage 200 on which the semiconductor package is mounted, the adsorptive force can be efficiently utilized. In an embodiment, the holes 210 formed on the stage 200 can be selectively closed, thereby suppressing the adsorptive force from being wasted.

A vacuum adsorption apparatus of a semiconductor package according to an embodiment of the present inventive concept will be described with reference to FIGS. 11 and 12.

Figure 11:
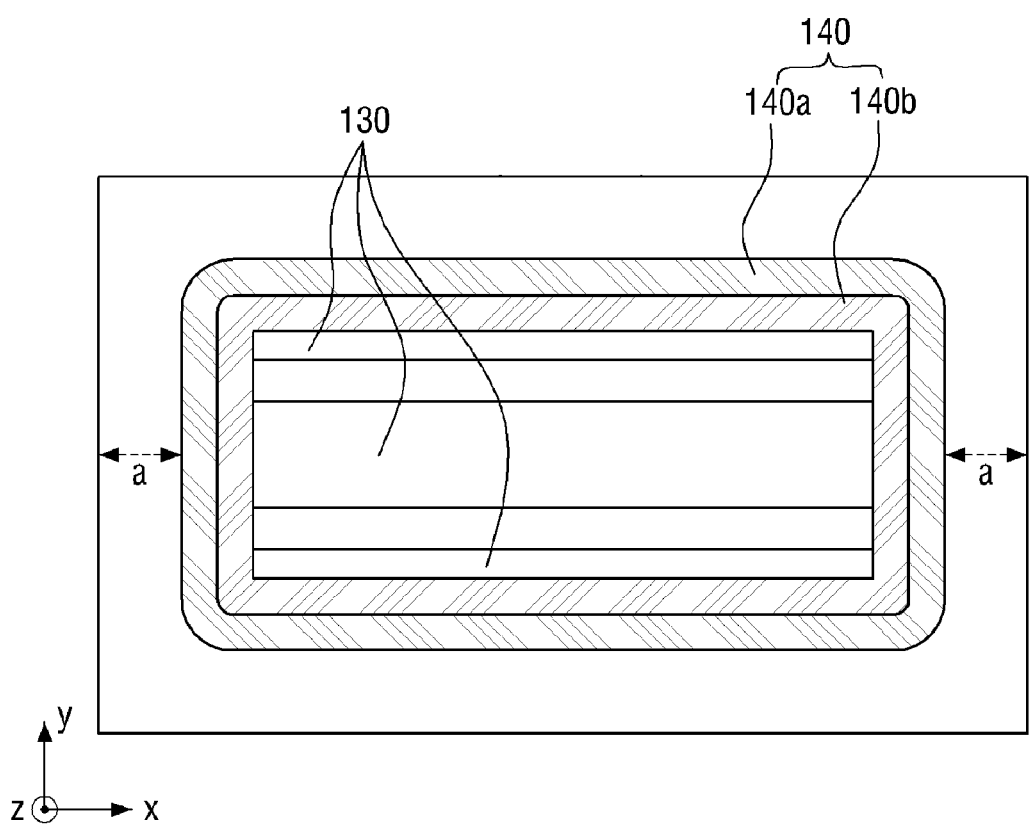
FIG. 11 is a plan view illustrating configurations of a housing and a vacuum adsorption unit in a vacuum adsorption apparatus of a semiconductor package according to an embodiment of the present inventive concept.

FIG. 11 is a plan view illustrating configurations of a housing and a vacuum adsorption unit in a vacuum adsorption apparatus of a semiconductor package according to an embodiment of the present inventive concept. FIG. 12 is a plan view for explaining driving of a closing unit of the vacuum adsorption apparatus of the semiconductor package according to an embodiment of the present inventive concept.

Figure 12:
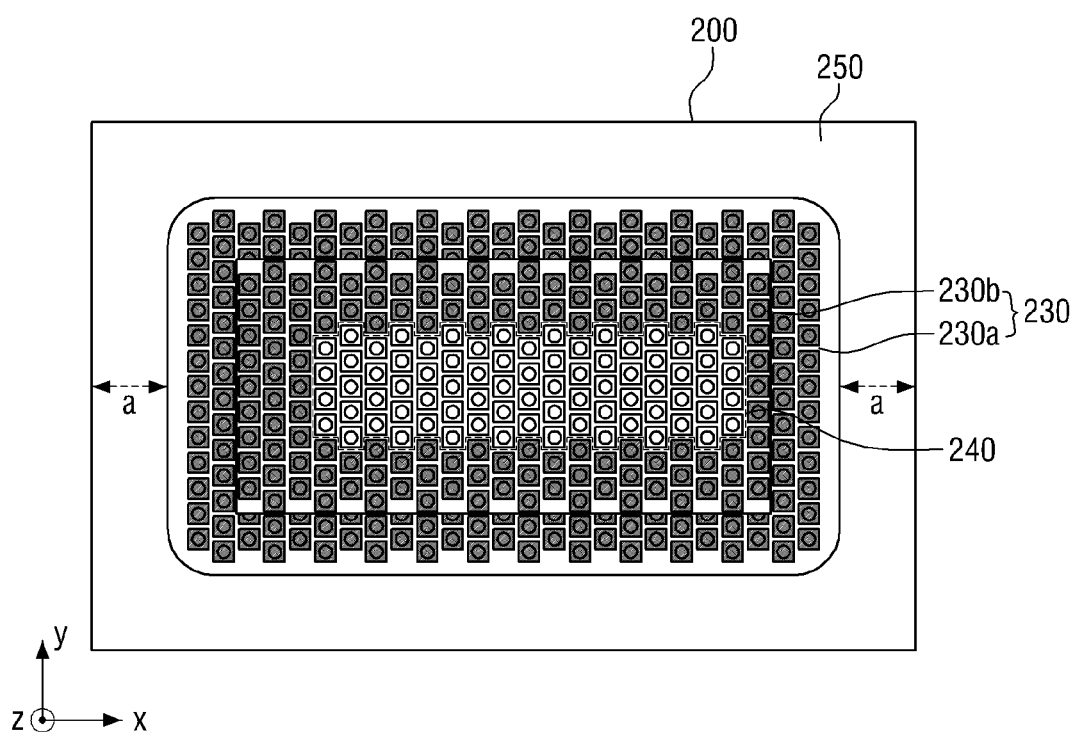
FIG. 12 is a plan view for explaining driving of a closing unit of the vacuum adsorption apparatus of the semiconductor package according to an embodiment of the present inventive concept.

Referring to FIGS. 11 and 12, a closing unit 140 may include a first closing unit 140a and a second closing unit 140b.

In an embodiment, the first closing unit 140a may be formed within an opening 150 of an upper housing 120. For example, the first closing unit 140a may be formed along the inner wall of the opening 150 of the upper housing 120. The first closing unit 140a may be formed along sidewalls of the opening 150 of the upper housing 120, thereby establish a centrally empty loop.

The first closing unit 140a may be spaced a predetermined distance (a) apart from a peripheral end of the upper housing 120. The first closing unit 140a may be upwardly lifted to be brought into close contact with the stage 200. If the first closing unit 140a is brought into close contact with the stage 200, a plurality of holes 210 formed along the peripheral region of the stage 200 may be closed.

The second closing unit 140b may be formed within the opening 150 of the upper housing 120. The second closing unit 140b may be formed along the side surface of the first closing unit 140a. The second closing unit 140b, formed along the side surface of the first closing unit 140a, may establish a centrally empty loop.

The second closing unit 140b may be spaced a distance apart from sidewalls of the opening 150, the distance corresponding to a thickness of the first closing unit 140a. The second closing unit 140b may move without interference with the first closing unit 140a. That is, the second closing unit 140b may vertically move, irrespective of vertical movement of the first closing unit 140a.

The stage 200 may include a first region 250, a second region 240 and a third region 230. The first region 250 is a region where the plurality of holes 210 are not provided on the stage 200. The second region 240 is a region where the first closing unit 140a and the second closing unit 140b do not overlap with each other. The plurality of holes 210 of the second region 240 may be in an opened state all the time.

The third region 230 is a region that is closed by the first closing unit 140a and the second closing unit 140b. The third region 230 includes a first closing region 230a and a second closing region 230b.

The first closing region 230*a* is a region that is closed by the first closing unit 140*a*. The first closing region 230*a* is a region where the plurality of holes 210 are closed when the first closing unit 140*a* upwardly moves to be brought into close contact with the stage 200.

The second closing region 230*b* is a region that is closed by the second closing unit 140*b*. The second closing region 230*b* is a region the plurality of holes 210 are closed when the second closing unit 140*b* upwardly moves to be brought into close contact with the stage 200.

The second closing unit 140*b* may be driven after the first closing region 230*a* is first closed by driving the first closing unit 140*a*, but aspects of the present inventive concept are not limited thereto. The first closing unit 140*a* and the second closing unit 140*b* may adjust the region having the holes 210 closed according to the number and sizes of the semiconductor packages. That is, only the first closing region 230*a* is closed to open the holes 210 of the second region 240 and the second closing region 230*b*. In an embodiment, the holes 210 of the first closing region 230*a* and the second closing region 230*b* are all closed, thereby opening only the holes 210 of the second region 240.

In the vacuum adsorption apparatus of the semiconductor package according to an embodiment of the present inventive concept, since the region where the holes are opened according to the number and sizes of semiconductor packages, it is possible to prevent an adsorptive force from being wasted, and efficient adsorption can be achieved.

In the illustrated embodiment, for brevity, two closing units and two closing regions are exemplified, but not limited thereto. That is, a plurality of closing units and a plurality of closing regions may be provided. In this case, as a second closing unit is formed within a first closing unit, a third closing unit may also be formed within the second closing unit.

The first closing region 230*a* is a region that is closed by the first closing unit 140*a*. The first closing region 230*a* is a region where the plurality of holes are closed when the first closing unit 140*a* upwardly moves to be brought into close contact with the stage 200.

The second closing region 230*b* is a region that is closed by the second closing unit 140*b*. The second closing region 230*b* is a region the plurality of holes are closed when the second closing unit 140*b* upwardly moves to be brought into close contact with the stage 200.

The second closing unit 140*b* may be driven after the first closing region 230*a* is first closed by driving the first closing unit 140*a*, but aspects of the present inventive concept are not limited thereto. The first closing unit 140*a* and the second closing unit 140*b* may adjust the region having the holes closed according to the number and sizes of the semiconductor packages. That is, only the first closing region 230*a* is closed to open the holes of the second region 240 and the second closing region 230*b*. In an embodiment, the holes of the first closing region 230*a* and the second closing region 230*b* are all closed, thereby opening only the holes of the second region 240.

In the vacuum adsorption apparatus of the semiconductor package according to an embodiment of the present inventive concept, since the region where the holes are opened according to the number and sizes of semiconductor packages, it is possible to prevent an adsorptive force from being wasted, and efficient adsorption can be achieved.

Hereinafter, a vacuum adsorption apparatus of a semiconductor package according to an embodiment of the present inventive concept will be described with reference to FIGS. 13 and 14.

Figure 13:
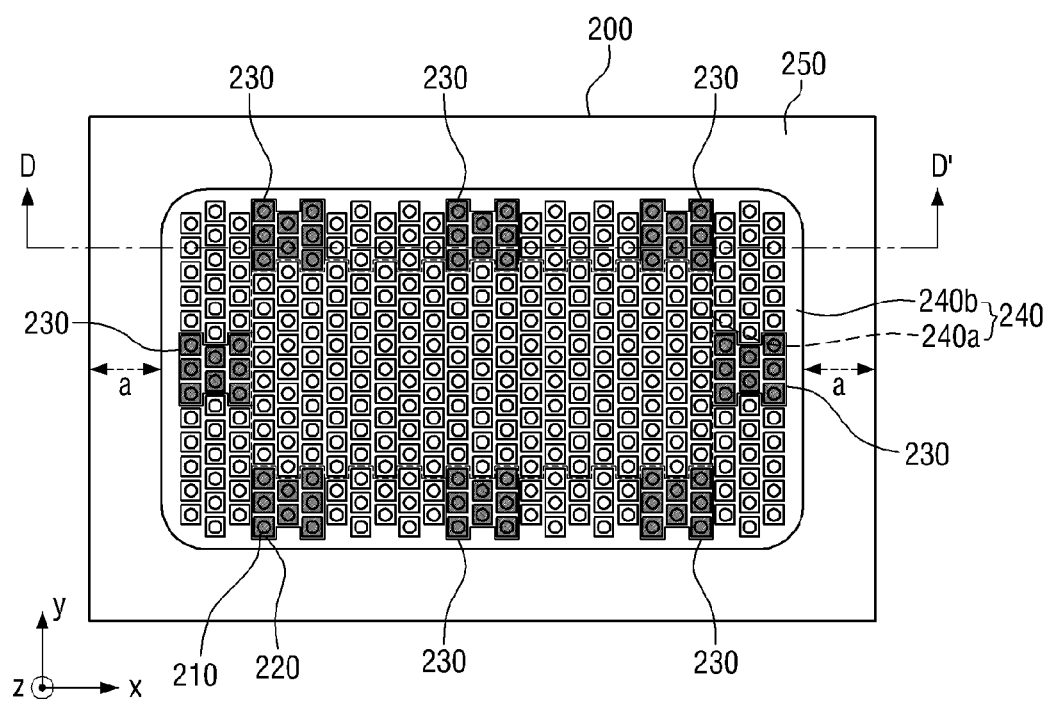
FIG. 13 is a plan view for explaining driving of a closing unit of a vacuum adsorption apparatus of a semiconductor package according to an embodiment of the present inventive concept.
Figure 14:
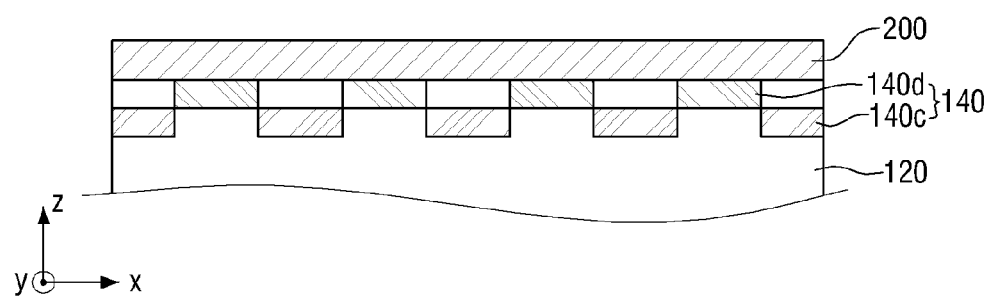
FIG. 14 is a cross-sectional view taken along the line D-D' of FIG. 13 according to an embodiment of the inventive concept.

FIG. 13 is a plan view for explaining driving of a closing unit of a vacuum adsorption apparatus of a semiconductor package according to an embodiment of the present inventive concept. FIG. 14 is a cross-sectional view taken along the line D-D' of FIG. 13 according to an embodiment of the inventive concept.

A stage 200 may include a first region 250, a second region 240 and a third region 230. The first region 250 is a region where a plurality of holes 210 are not formed on the stage 200.

The second region 240 is a region where the plurality of holes 210 are opened. The second region 240 includes an open area 240*a* and a hole opening/closing area 240*b*.

The open area 240*a* is an area that is not closed by the closing unit 140. The plurality of holes 210 of the open area 240*a* may be in an opened state all the time. The hole opening/closing area 240*b* is an area that is closed by the closing unit 140 but is not selectively closed. The hole opening/closing area 240*b* may be continuously switched according to driving of the closing unit 140

The third region 230 is a region that is closed by the closing unit 140. The third region 230 may be closed or may not be closed by the closing unit 140. That is, as the hole opening/closing area 240*b* is continuously switched according to driving of the closing unit 140, the third region 230 may also be continuously switched according to driving of the closing unit 140.

The closing unit 140 may include a third closing unit 140*c* and a fourth closing unit 140*d*. The closing unit 140 may be divided into blocks to be separately driven. That is, a plurality of driving modules are installed in the respective blocks of the closing unit 140 and it may be determined whether the respective of the closing unit 140 are to upwardly move to be independently brought into close contact with the stage 200. Therefore, the hole opening/closing area 240*b* may be formed by the third closing unit 140*c* that does not upwardly move, and the third region 230 may be formed by the fourth closing unit 140*d* that upwardly moves.

With this configuration of the closing unit 140, semiconductor packages may be disposed on a peripheral region of the stage 200. Therefore, the closing unit 140 may be configured to allow an adsorptive force to be applied to portions of the stage 200, where semiconductor packages are disposed, and to prevent an adsorptive force from being applied to portions of the stage 200, where semiconductor packages are not disposed. Accordingly, it is possible to suppress the adsorptive force from being wasted, and efficient adsorption can be achieved. That is, in the vacuum adsorption apparatus of the semiconductor package according to an embodiment of the present inventive concept, the adsorptive force may be more efficiently provided.

Figure 15:
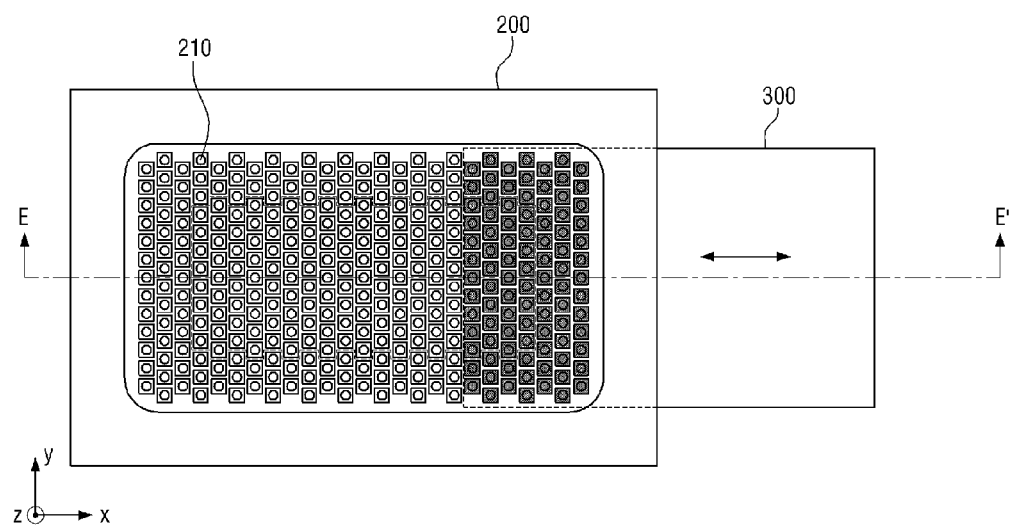
FIG. 15 is a plan view for explaining driving of a closing unit of a vacuum adsorption apparatus of a semiconductor package according to an embodiment of the present inventive concept.
Figure 16:
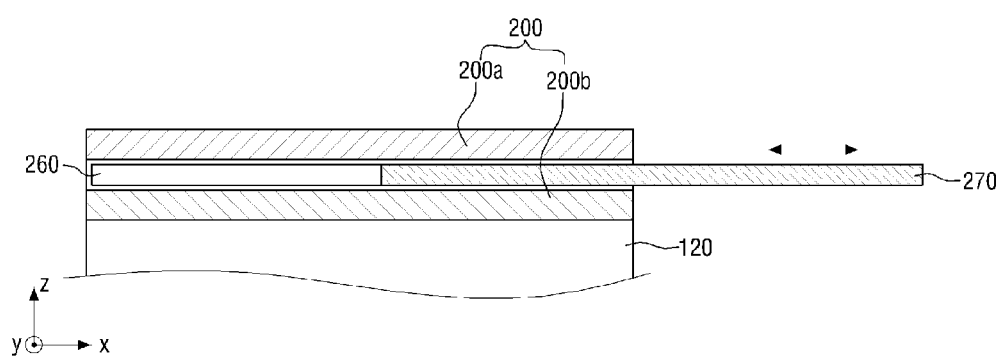
FIG. 16 is a cross-sectional view taken along the line E-E' of FIG. 15 according to an embodiment of the inventive concept.

A vacuum adsorption apparatus of a semiconductor package according to an embodiment of the present inventive concept will be described with reference to FIGS. 15 and 16. FIG. 15 is a plan view for explaining driving of a closing unit of a vacuum adsorption apparatus of a semiconductor package according to an embodiment of the present inventive concept. FIG. 16 is a cross-sectional view taken along the line E-E' of FIG. 15 according to an embodiment of the inventive concept.

Referring to FIGS. 15 and 16, in the semiconductor package according to an embodiment of the present inventive concept, a stage 200 includes a first plate 200*a*, a second plate 200*b* and an entrance space 260.

In an embodiment, a first plate 200*a* may form a top surface of the stage 200. The first plate 200*a* may include a plurality of holes 210. The first plate 200a may be a region on which a semiconductor package is mounted. The first plate 200a may have a top surface made of silicon to prevent the semiconductor package from slipping. The first plate 200a may comprise a rigid material to support the semiconductor package. The first plate 200a may include, for example, a metal.

The first plate 200a may form a bottom surface of the stage 200. The second plate 200b may include a plurality of holes 210. The second plate 200b may include the plurality of holes 210 located to correspond to the holes 210 of the first plate 200a, but aspects of the present inventive concept are not limited thereto. The second plate 200b may include a rigid material. The second plate 200b may include the same material with the first plate 200a.

The second plate 200b may include, for example, a metal.

A vacuum adsorption unit 130 may be installed below the stage 200. The vacuum adsorption unit 130 installed below the stage 200 may directly generate an adsorptive force. Therefore, the semiconductor package mounted on the stage 200 can be efficiently adsorbed and fixed on the stage 200.

The entrance space 260 may be formed between the first plate 200a and the second plate 200b. A cover plate 270 may be inserted into the entrance space 260. The entrance space 260 may have a height corresponding to a thickness of the cover plate 270 to close the holes 210 formed on the first plate 200a and the second plate 200b with insertion of the cover plate 270.

The semiconductor package according to the fourth second embodiment of the present inventive concept may include the cover plate 270, a cover sensor and a cover control module.

In an embodiment, the cover plate 270 may be inserted into the entrance space 260 to close all of the holes 210 of the stage 200. The cover plate 270 may be inserted in a first direction. As shown, the first direction may be, for example, the X-axis direction. As the cover plate 270 is inserted in the first direction, the plurality of holes 210 of the stage 200 are gradually closed. Then, as the cover plate 270 is extracted in a direction opposite to the first direction, the plurality of holes 210 of the stage 200 are gradually opened.

The cover sensor may determine on which part of the stage the semiconductor package has been mounted. The cover sensor may be any kind of sensor, including an optical sensor, a pressure sensor, and so on. The cover sensor may sense on which part of the stage the semiconductor package is positioned to transmit a signal indicating the sensing result to the cover control module.

The cover control module may receive the sensing signal from the cover sensor and may shift the cover plate 270. The cover control module may insert the cover plate 270 into a position with which the position of the semiconductor package mounted does not overlap. Accordingly, the cover plate 270 may close at least some of the plurality of holes 210, thereby suppressing the adsorptive force of the vacuum adsorption unit 130 from being wasted while increasing the adsorption efficiency.

Figure 17:
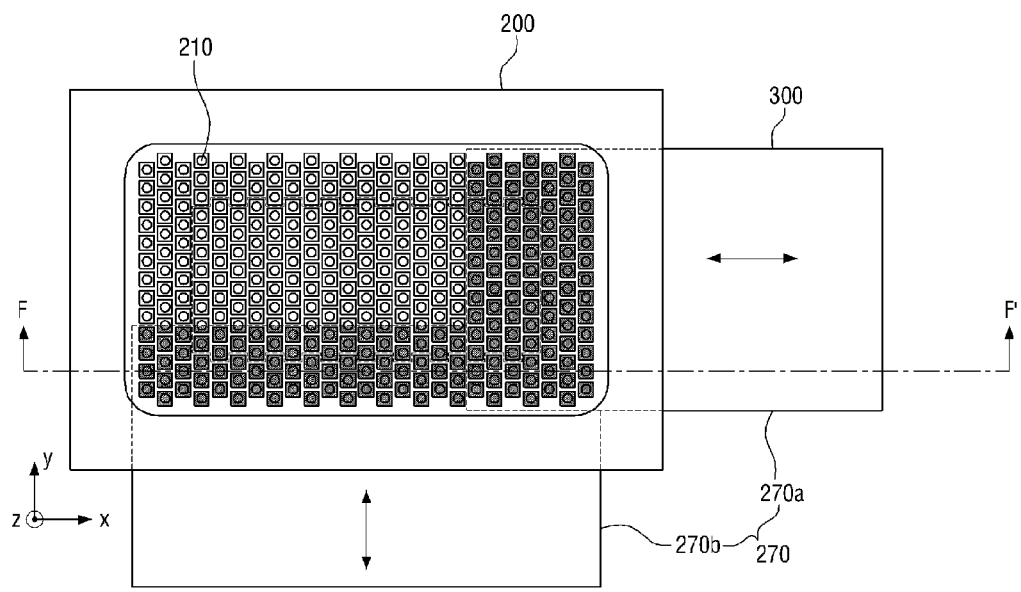
FIG. 17 is a plan view for explaining driving of a closing unit of a vacuum adsorption apparatus of a semiconductor package according to an embodiment of the present inventive concept.
Figure 18:
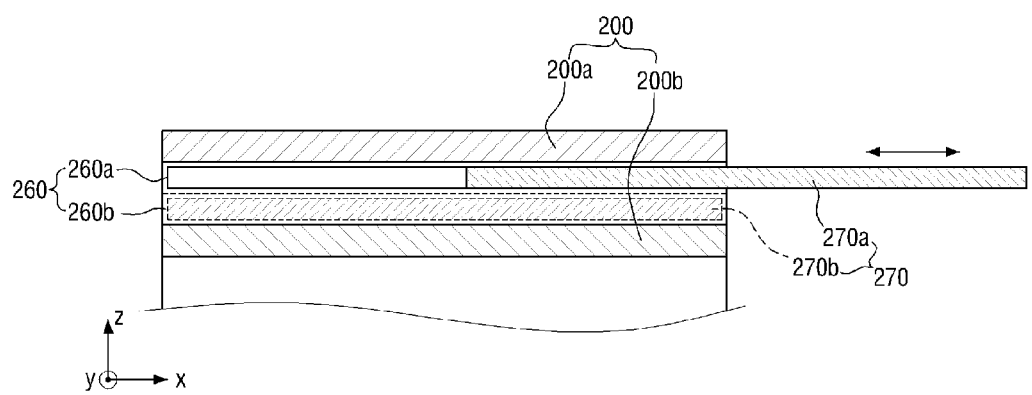
FIG. 18 is a cross-sectional view taken along the line F-F' of FIG. 16 according to an embodiment of the inventive concept.

Hereinafter, a vacuum adsorption apparatus of a semiconductor package according to an embodiment of the present inventive concept will be described with reference to FIGS. 17 and 18. FIG. 17 is a plan view for explaining driving of a closing unit of a vacuum adsorption apparatus of a semiconductor package according to an embodiment of the present inventive concept. FIG. 18 is a cross-sectional view taken along the line F-F' of FIG. 16 according to an embodiment of the inventive concept.

Referring to FIGS. 17 and 18, a cover plate 270 includes a first cover plate 270a and a second cover plate 270b. An entrance space 260 may include a first entrance space 260a and a second entrance space 260b.

In an embodiment, the first cover plate 270a may be inserted into the entrance space 260 in a first direction. The first cover plate 270 inserted into the first entrance space 260a may close all of holes 210 of the stage 200. As shown, the first direction may be, for example, the X-axis direction. As the first cover plate 270a is inserted in the first direction, the plurality of holes 210 of the stage 200 are gradually closed. Then, as the first cover plate 270a is extracted in a direction opposite to the first direction, the plurality of holes 210 of the stage 200 are gradually opened.

The second cover plate 270b may be inserted into the second entrance space 260b in a second direction. The second cover plate 270b inserted into the second entrance space 260b may close all of holes 210 of the stage 200. As shown, the second direction may be, for example, the Y-axis direction. As the second cover plate 270b is inserted in the second direction, the plurality of holes 210 of the stage 200 are gradually closed. Then, as the second cover plate 270b is extracted in a direction opposite to the second direction, the plurality of holes 210 of the stage 200 are gradually opened.

The first direction and the second direction may cross each other. As described above, the first direction may be the X-axis direction and the second direction may be the Y-axis direction, but aspects of the present inventive concept are not limited thereto. The first direction and the second direction may be any directions as long as they cross each other.

The first cover plate 270 moves toward the first entrance space 260a and the first entrance space 260a may have a first vertical level. The second cover plate 270b moves toward the second entrance space 260b and the second entrance space 260b may have a second vertical level. The first and second vertical levels may be different from each other. That is to say, the first entrance space 260a and the second entrance space 260b may be formed at different heights. Therefore, the first cover plate 270b and the second cover plate 270b may move without being interfered with each other.

The vacuum adsorption apparatus of the semiconductor package according to an embodiment of the present inventive concept has been described with regard to an exemplary case where two cover plates are provided, but aspects of the preset invention are not limited thereto. However, the inventive concept of the present inventive concept may also be applied to a case where a plurality of cover plates are provided.

Since the vacuum adsorption apparatus of the semiconductor package according to an embodiment of the present inventive concept includes a plurality of cover plates, the plurality of holes that are not covered by the semiconductor package can be more efficiently closed, thereby preventing an adsorptive force from being wasted while increasing the adsorption efficiency.

Figure 19:
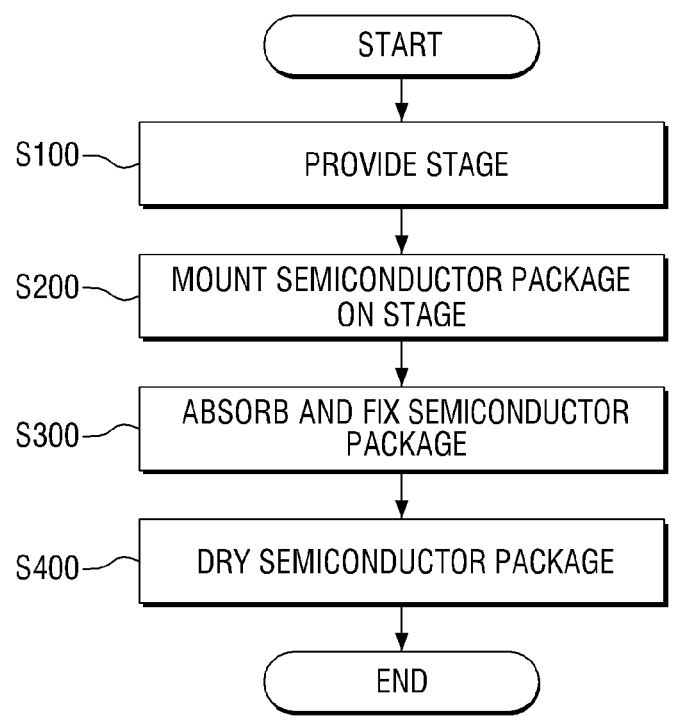
FIG. 19 is a flowchart for explaining a vacuum adsorption method of a semiconductor package according to an embodiment of the present inventive concept.
Figure 20:
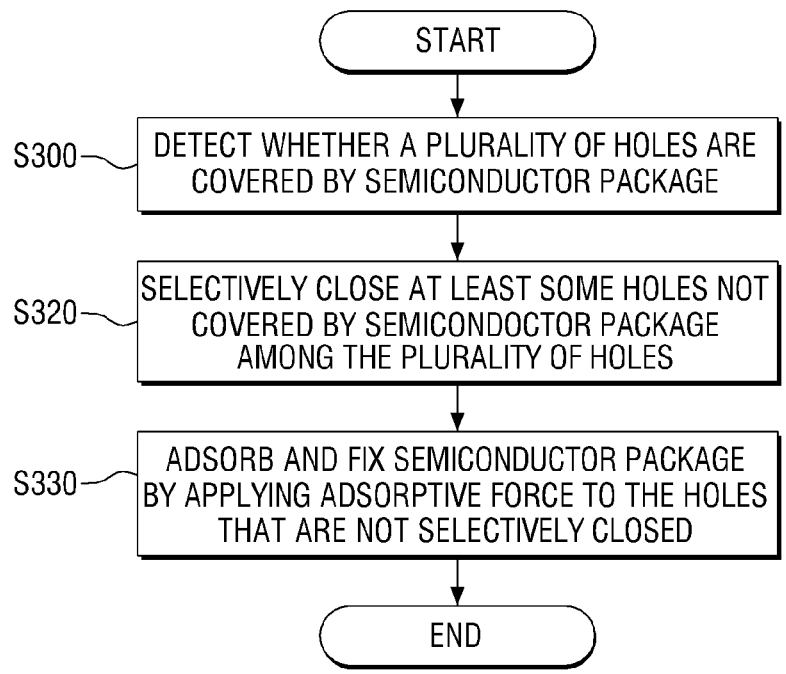
FIG. 20 is a flowchart describing adsorbing and fixing a semiconductor package in the vacuum adsorption method shown in FIG. 19 according to an embodiment of the inventive concept.

A vacuum adsorption method of a semiconductor package according to an embodiment of the present inventive concept will be described with reference to FIGS. 1, 4, 5, 9, 19 and 20. FIG. 19 is a flowchart for explaining a vacuum adsorption method of a semiconductor package according to an embodiment of the present inventive concept. FIG. 20 is a flowchart for specifically illustrating adsorbing and fixing a semiconductor package in the vacuum adsorption method shown in FIG. 19.

Referring to FIG. 19, the stage 200 is provided (S100).

In an embodiment, referring to FIGS. 4 and 5, the stage 200 may be positioned on the housing 100. For example, the stage 200 may cover a top portion of the upper housing 120. The stage 200 may contact the upper housing 120 but may not be adhered to the upper housing 120. In an embodiment, the stage 200 may be adhered to the upper housing 120.

The stage 200 includes a hole 210 and a stepped portion 220. In an embodiment, the hole 210 may be formed while passing through the stage 200. The hole 210 may include a plurality of holes. The plurality of holes 210 may be arranged at regular intervals. In an embodiment, the holes 210 may be periodically arranged. As the plurality of holes 210 are formed on the stage 200, the adsorptive force generated from the vacuum adsorption unit 130 positioned below the stage 200 may be applied to the top surface of the stage 200.

The stepped portion 220 may be provided around the plurality of holes 210. The stepped portion 220 may be slightly lower than the top surface of the stage 200. The stepped portion 220 may be formed to have a sufficiently smaller size than the semiconductor package to allow the semiconductor package to be placed on the top surface of the stage 200 to be parallel with the top surface of the stage 200. The stepped portion 220 is not particularly limited in view of shape, but may be shaped as a rectangle, as shown.

As the stepped portion 220 is formed around the hole 210, a vacuum area may be considerably increased. Therefore, since the adsorptive force of the semiconductor package is increased, the efficiency of the vacuum adsorption apparatus of the semiconductor package according to the first embodiment of the present inventive concept can be increased.

Referring again to FIG. 19, the semiconductor package is mounted on the stage 200 (S200).

In an embodiment, referring back to FIG. 5, the stage 200 may allow the semiconductor package to be mounted thereon. The stage 200 may be shaped to be planar to allow the semiconductor package to be mounted thereon. The stage 200 may have a top surface wide enough to mount a plurality of semiconductor packages. The plurality of semiconductor packages may be arranged on the top surface of the stage 200 to then be mounted thereon.

The top surface of the stage 200 may be made of silicon, but not limited thereto. Since the top surface of the stage 200 comprises silicon, it is possible to prevent the semiconductor packages mounted on the top surface of the stage 200 from slipping. The stage 200 may include a rigid metal to support the semiconductor packages on the opening 150 of the upper housing 120. Here, the top surface of the stage 200 may be made of silicon to prevent the semiconductor packages from slipping.

Therefore, once mounted on the stage 200, the semiconductor packages may be arranged without slipping.

Referring again to FIG. 19, the semiconductor package is adsorbed and fixed (S300).

Referring to FIGS. 4 and 5, if the semiconductor package is mounted on the top surface of the stage 200, an adsorptive force is generated through the plurality of holes 210 to make the semiconductor package brought into close contact with the top surface of the stage 200. In such a manner, the semiconductor package may be fixed on the top surface of the stage 200.

Referring again to FIG. 19, the semiconductor package is dried (S400).

Referring to FIG. 1, the drying unit 300 may be positioned on the housing 100 and the stage 200. The drying unit 300 may include a plurality of air blows. The air blows may spray a second fluid to dry moisture of the semiconductor package. The second fluid used in the air blows may be air, but not limited thereto. Any fluid can be used as the second fluid as long as it is capable of drying the moisture of the semiconductor package. For example, the second fluid may be compressed air or inert gas, but not limited thereto.

The drying unit 300 may overlap at least a portion of the top surface of the stage 200 on the housing 100 and the stage 200. Even if the drying unit 300 does not entirely overlap with the stage 200, it may spray the second fluid on the entire top surface of the stage 200 by adjusting a spraying direction of the second fluid. That is, the drying unit 300 including the plurality of air blows may spray the second fluid from some of the air blows with a predetermined slope. Accordingly, the moisture of the semiconductor package on the stage 200 can be dried. In an embodiment, the moisture of the semiconductor package can be completely removed.

Referring to FIG. 20, the adsorbing and fixing of the semiconductor package will now be described in detail.

Referring to FIG. 20, it is detected whether the plurality of holes are covered by the semiconductor package (S310).

It is determined using a cover sensor on which part of the stage the semiconductor package has been mounted. The cover sensor may be any kind of sensor, including an optical sensor, a pressure sensor, and so on. The cover sensor may sense on which part of the stage the semiconductor package is positioned to transmit a signal indicating the sensing result to the cover control module.

Referring to FIG. 20, at least some of the holes that are not covered by the semiconductor package are closed (S320).

Referring to FIG. 9, the holes that are not covered by the semiconductor package among the plurality of holes may be closed by the closing unit 140.

The closing unit 140 may be vertically driven using a cylinder. The cylinder may be, for example, a hydraulic cylinder. The cylinder may include at least one cylinder for driving the closing unit 140. That is, a single cylinder may integrally drive the overall closing unit 140, or a plurality of cylinders may be installed at multiple areas of the closing unit 140 to drive the closing unit 140.

Referring again to FIG. 20, the semiconductor package is adsorbed and fixed by applying an adsorptive force to the holes that are not closed (S330).

The holes 210 not covered by the semiconductor package are closed by the closing unit 140, thereby preserving the adsorptive force of the vacuum adsorption unit 130. The adsorptive force of the vacuum adsorption unit 130 may be intensively applied to the holes 210 in the open area 240a.

In the vacuum adsorption method of the semiconductor package according to an embodiment of the present inventive concept, the holes 210 formed on the stage 200 can be selectively closed, thereby suppressing the adsorptive force from being wasted.

While the present inventive concept has been particularly shown and described with reference to exemplary embodiments thereof, it will be understood by those of ordinary skill in the art that various changes in form and details may be made therein without departing from the spirit and scope of the present inventive concept as defined by the following claims. It is therefore desired that the present embodiments be considered in all respects as illustrative and not restrictive, reference being made to the appended claims rather than the foregoing description to indicate the scope of the invention.

What is claimed is:

1. A vacuum adsorption apparatus of a semiconductor package, the vacuum adsorption apparatus comprising:

a housing having an opening and a top surface, the top surface of the housing defining the opening of the housing;

a vacuum adsorption unit disposed in the housing; and a stage having a top surface and a bottom surface, the bottom surface of the stage being on the top surface of the housing and covering the opening of the housing and the stage including a plurality of holes, wherein at least one of the plurality of holes is connected to the opening of the housing, and wherein the top surface of the stage is higher than the top surface of the housing, and wherein each of the plurality of holes penetrates from the top surface of the stage to the bottom surface of the stage.

2. The vacuum adsorption apparatus of claim 1, wherein the vacuum adsorption unit includes at least one of a vacuum cartridge, a vacuum pad and a vacuum pump.

3. The vacuum adsorption apparatus of claim 1, wherein the vacuum adsorption unit includes a body for passage of a fluid, and a suction hole formed in the body and generating an adsorptive force to the top surface of the stage through the opening and the plurality of holes according to the passage of the fluid.

4. The vacuum adsorption apparatus of claim 3, wherein the fluid includes compressed air.

5. The vacuum adsorption apparatus of claim 1, wherein the stage includes patterns each having a stepped portion formed in the vicinity of the plurality of holes.

6. The vacuum adsorption apparatus of claim 1, wherein the top surface of the stage comprises silicon.

7. The vacuum adsorption apparatus of claim 1, further comprising:

a drying unit disposed on the stage and drying moisture of the semiconductor package.

8. The vacuum adsorption apparatus of claim 7, wherein the drying unit dries the semiconductor package by spraying a fluid onto the stage.

9. The vacuum adsorption apparatus of claim 1, further comprising:

a vacuum pressure sensor measuring a vacuum pressure of the vacuum adsorption unit; and a display unit displaying the vacuum pressure.

10. The vacuum adsorption apparatus of claim 9, further comprising:

a controller increasing an output of the vacuum adsorption unit when the vacuum pressure measured by the vacuum pressure sensor is smaller than a predetermined reference vacuum pressure and decreasing the output of the vacuum adsorption unit when the vacuum pressure measured by the vacuum pressure sensor is greater than the predetermined reference vacuum pressure.

11. The vacuum adsorption apparatus of claim 1, further comprising:

a closing unit disposed within the opening and disposed along a side surface of the opening, wherein the closing unit is movable so that the closing unit, at a first position, is spaced apart from the stage and the closing unit, at a second position, is in direct contact with the remaining holes of the plurality of holes other than the at least one of the plurality of holes, and wherein the remaining holes of the plurality of holes is closed.

12. A vacuum adsorption apparatus of a semiconductor package, the vacuum adsorption apparatus comprising:

a stage having a plurality of holes, wherein the semiconductor package is mounted on the stage;

at least one vacuum cartridge positioned under the stage and generating an adsorptive force through a suction hole according to passage of compressed air; and a housing in which the vacuum cartridge is accommodated and of which a top surface is on a bottom surface of the stage so that the housing supports the stage, wherein a top surface of the stage is higher than the top surface of the housing, and wherein the semiconductor package is fixed on the stage by the adsorptive force of the vacuum cartridge.

13. The vacuum adsorption apparatus of claim 12, wherein the stage includes a first plate, a second plate positioned under the first plate, and an entrance space between the first and second plates, the vacuum adsorption apparatus further comprising a cover plate closing at least some of the plurality of holes as the vacuum adsorption apparatus is inserted into the entrance space.

14. The vacuum adsorption apparatus of claim 13, further comprising:

a cover sensor sensing whether each of the plurality of holes is covered by the semiconductor package; and a cover control module closing at least some of the plurality of holes not covered by the semiconductor package by moving the cover plate based on positions of the plurality of holes covered by the semiconductor package.

15. The vacuum adsorption apparatus of claim 13, wherein the cover plate includes a first cover plate moving in a first direction and covering the stage, and a second cover plate moving in a second direction crossing the first direction and covering the stage.

16. The vacuum adsorption apparatus of claim 15, wherein the first cover plate moves at a first vertical level of the entrance space, the second cover plate moves at a second vertical level of the entrance space, and the first vertical level and the second vertical level are different from each other.

* * * * *